(12) United States Patent
Bois et al.

(10) Patent No.: US 9,820,374 B2
(45) Date of Patent: Nov. 14, 2017

(54) USE OF HYBRID PCB MATERIALS IN PRINTED CIRCUIT BOARDS

(75) Inventors: Karl J. Bois, Fort Collins, CO (US); Ramon R. Campa, Tomball, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 1717 days.

(21) Appl. No.: 13/061,493

(22) PCT Filed: Aug. 30, 2008

(86) PCT No.: PCT/US2008/074943
§ 371 (c)(1),
(2), (4) Date: Feb. 28, 2011

(87) PCT Pub. No.: WO2010/024823
PCT Pub. Date: Mar. 4, 2010

(65) Prior Publication Data
US 2011/0157842 A1    Jun. 30, 2011

(51) Int. Cl.
*H05K 1/00* (2006.01)
*H05K 1/02* (2006.01)
*H05K 3/46* (2006.01)

(52) U.S. Cl.
CPC ........... *H05K 1/024* (2013.01); *H05K 3/4688* (2013.01); *H05K 3/4626* (2013.01)

(58) Field of Classification Search
USPC .................... 361/748, 360, 361; 174/250
See application file for complete search history.

(56) References Cited

U.S. PATENT DOCUMENTS

| | | | |
|---|---|---|---|
| 4,925,024 A | 5/1990 | Ellenberger et al. | |
| 5,652,055 A | 7/1997 | King et al. | |
| 6,890,635 B2 | 5/2005 | Lin et al. | |
| 7,265,181 B2 | 9/2007 | Lin et al. | |
| 7,378,598 B2 | 5/2008 | Bois et al. | |
| 7,416,972 B2 | 8/2008 | Japp et al. | |
| 7,470,990 B2 | 12/2008 | Japp et al. | |
| 7,730,613 B2* | 6/2010 | Vasoya | 29/852 |
| 7,989,895 B2* | 8/2011 | White et al. | 257/379 |
| 8,242,380 B2 | 8/2012 | Bois et al. | |
| 2003/0098177 A1* | 5/2003 | Cheng | 174/261 |
| 2005/0183883 A1 | 8/2005 | Bois et al. | |

(Continued)

FOREIGN PATENT DOCUMENTS

| | | |
|---|---|---|
| CN | 1658734 A | 8/2005 |
| CN | 1838855 A | 9/2006 |
| EP | 1705974 | 9/2006 |

OTHER PUBLICATIONS

Rick Hartley, "Designing PCBs with Mixed Materials," Printed Circuit Design and Manufacture Magazine, Mar. 30, 2006, 4 pages http://pcdandf.com/cms/index2php?option=com.

(Continued)

*Primary Examiner* — Andargie M Aychillhum
(74) *Attorney, Agent, or Firm* — Conley Rose, P.C.

(57) ABSTRACT

A apparatus comprising a printed circuit board ("PCB"). The PCB comprises a first insulating layer and a second insulating layer. The first insulating layer is made of a first material and the second insulating layer is made of a second material. The first material has a lower dissipation factor than the second material. The first material and second material have substantially similar dielectric constants.

17 Claims, 4 Drawing Sheets

(56) References Cited

U.S. PATENT DOCUMENTS

| | | |
|---|---|---|
| 2005/0218524 A1 | 10/2005 | Japp et al. |
| 2007/0040626 A1* | 2/2007 | Blair et al. ................. 333/1 |
| 2007/0040689 A1* | 2/2007 | Reynolds ................. 340/572.7 |
| 2007/0090894 A1* | 4/2007 | Phan et al. ................. 333/33 |
| 2007/0182016 A1 | 8/2007 | Japp et al. |
| 2008/0196933 A1 | 8/2008 | Bois et al. |
| 2010/0323477 A1* | 12/2010 | Arnal et al. ................. 438/121 |

OTHER PUBLICATIONS

International Search Report and Written Opinion, dated Mar. 13, 2009, 11 pages.

\* cited by examiner

USE OF HYBRID PCB MATERIALS IN PRINTED CIRCUIT BOARDS

BACKGROUND

Virtually every electronic device includes one or more varieties of printed circuit boards ("PCBs") (also referred to as printed wiring boards or "PWBs"). PCBs are relatively thin, layered substrates upon which integrated circuits and other electronic components are mounted. A printed circuit board typically includes a plurality of electrically conductive and insulating layers arranged in a sandwich-like fashion. Conductive layers generally have conductive paths or traces, which are chemically or mechanically etched out of the bulk conductive layer, thus isolated from one another by insulating material and routed within a plane. These traces are generally designed to electrically contact conductive portions of the electronic components mounted on the PCB, forming electrical interconnects. Insulating layers electrically isolate conductive layers from one another. The principle structure of conductive traces and layers of insulating material is also used on a smaller scale within a packaged microchip having a PCB-like package substrate.

The insulating layers typically are made of preimpregnated (prepreg) materials such as FR-2 (Phenolic cotton paper), FR-3 (Cotton paper and epoxy), and FR-4 (Woven glass and epoxy). FR-4 is the material of choice in the building of PCBs used in high-end industrial, consumer, and military electronic equipment due to its ability to absorb less moisture, its strength and stiffness, and its flame resistance. Numerous variations of FR-4 are available on the market, such as FR-408 and Polyclad 370HR. FR-408 has a lower dissipation factor at high frequencies than many other materials making it desirable for use in PCBs requiring the use of high speed signals. However, FR-408 and other insulating materials that have low dissipation factors at high frequencies have higher costs. It would be desirable to manufacture a PCB at lower cost while maintaining the capabilities of materials such as FR-408.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
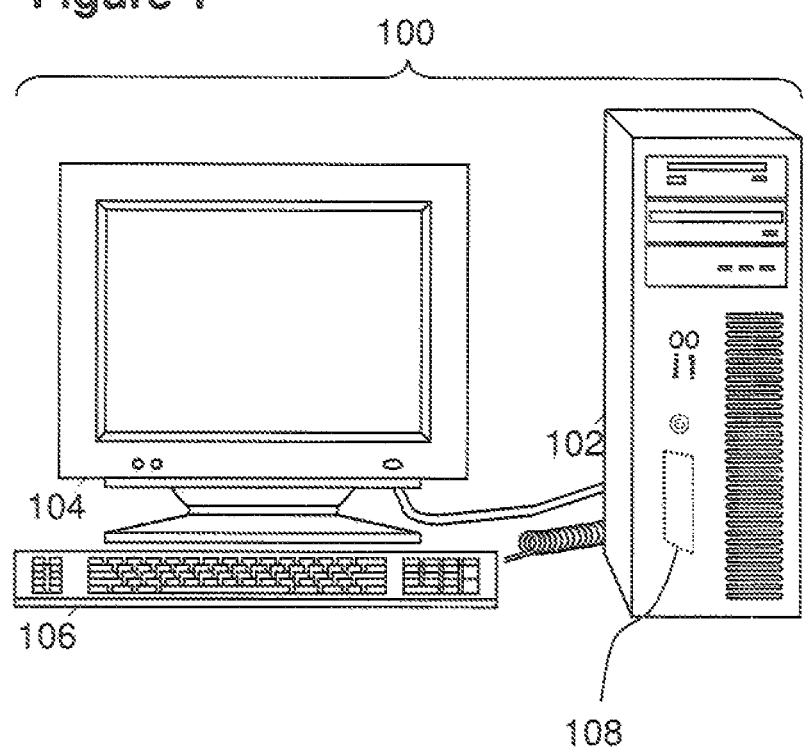
FIG. 1 illustrates ah electronic device in accordance with embodiments of the invention.

FIG. 1 illustrates an electronic device 100 in accordance with embodiments of the invention. As shown in FIG. 1, the electronic device 100 comprises a chassis 102, a display 104, and an input device 106. The chassis 102 is coupled to the display 104 and the input device 106 to enable the user to interact with electronic device 100. The display 104 and the input device 106 may together operate as a user interface. The display 104 is shown as a video monitor, but may take many alternative forms such as a printer, a speaker, or other means for communicating information to a user. The input device 106 is shown as a keyboard, but may similarly take many alternative forms such as a button, a mouse, a keypad, a dial, a motion sensor, a camera, a microphone or other means for receiving information from a user. Both the display 104 and the input device 106 may be integrated into the chassis 102.

The chassis 102 may comprise a processor, memory, and information storage devices which are coupled to a printed circuit board ("PCB") 108. PCB 108 provides a base for interconnecting semiconductor components, input/output connectors and/or other electronic components and may be representative of a motherboard. At least some of the electronic components inside the electronic device 100 are soldered to PCB 108. The chassis 102 may further comprise a network interface (not shown) that allows the system 100 to receive information via a wired or wireless network.

Although electronic device 100 is representative of a desktop computer, alternative embodiments may vary with respect to size, shape, computing capacity and/or features. Examples of such electronic devices include, but are not limited to, laptop computers, DVD players, CD players, game systems, personal digital assistants ("PDAs"), cellular phones, smart phones, GPS devices, user input devices (mouse, keyboard) or other electronic devices having PCBs.

Figure 2:
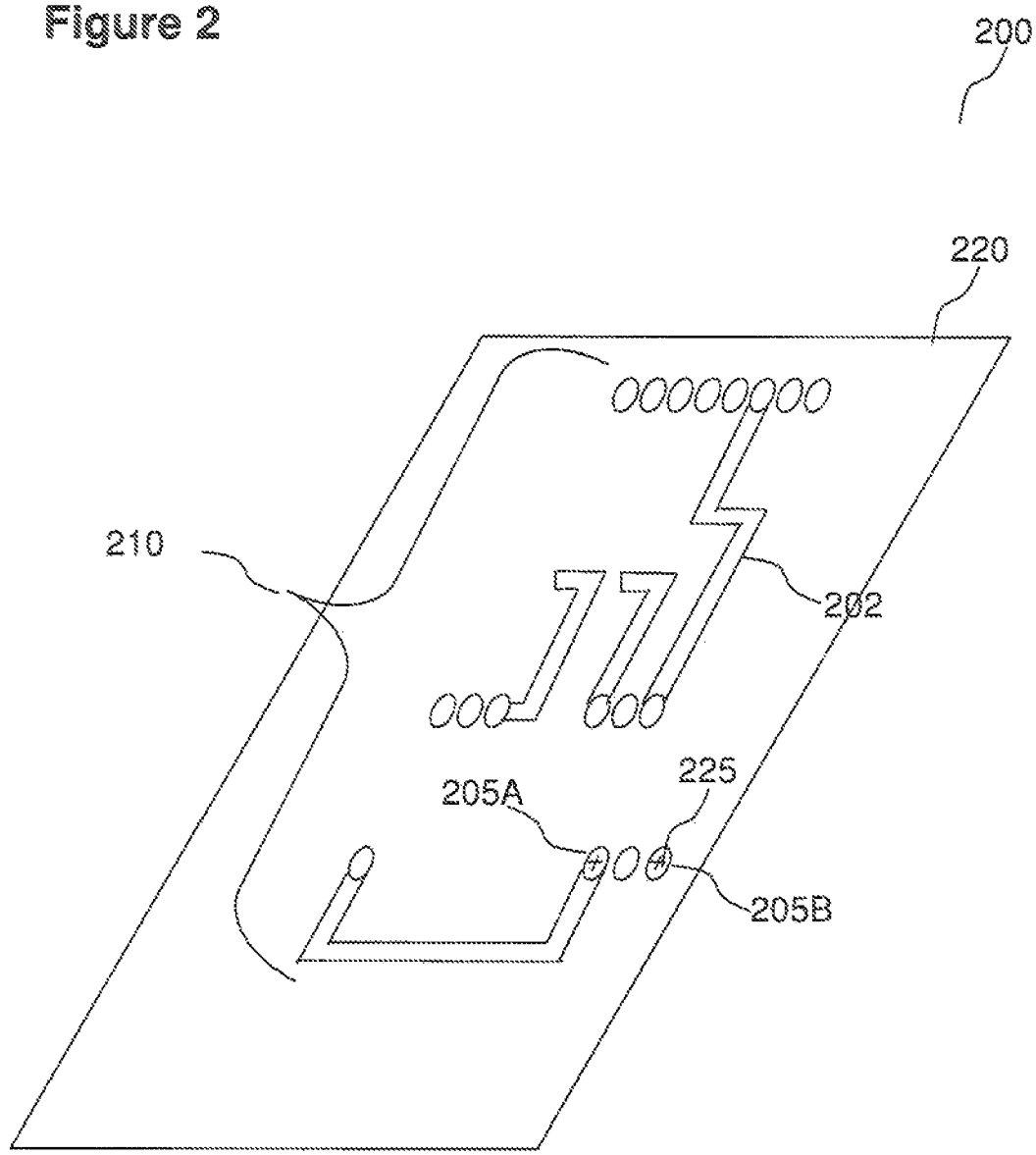
FIG. 2 illustrates an exploded view of an exemplary printed circuit board layer in accordance with embodiments of the invention.

FIG. 2 illustrates an exploded view of an exemplary PCB subcomponent 200 of PCB 108 in accordance with embodiments of the invention. PCB subcomponent 200 includes conductive layer 210 and an insulating layer 220 surrounding conductive layer 210. Although a single conductive and insulating layer is depicted for ease of discussion, it will be appreciated that numerous layers are possible.

Conductive layer 210 is generally made of a metal with a high electrical conductivity, such as copper (Cu) or tungsten (W). These metallic conductive layers are used to provide power and ground planes for PCB subcomponent 200, or alternatively, they are patterned to form conductive paths, such as traces 202 and pads 205A-B, which enable signals to flow from one point of PCB subcomponent 200 to another.

Trace 202 and pads 205A-B are organized or patterned using various methods. For example, patterning occurs by way of chemical vapor deposition ("CVD"), through a series of etching steps, or by printing a layer of metallic ink using an ink-jet printer.

Some pads couple to trace 202 while other pads do not. For example, pad 205A couple to trace 202. Thus, pad 205A couples the trace to which it is attached to additional conductive layers.

Insulating layer 220 is preferably disposed about conductive layer 210 to surround trace 202 and pads 205A-B preventing traces and pads from making contact with each other. Insulating layers, such as insulating layer 220, are generally made of a ceramic, such as alumina, or other dielectric material, such as TEFLON® (by Du Pont), or FR-4 (a glass epoxy resin widely used in PCB fabrication). Suitable vendors of FR-4 include Isola (formerly Polyclad), Nelco, Arlon, Allied Signal, and Gore.

There are a variety of specific materials that may be used to fabricate FR-4 insulating layer 220 in accordance with various embodiments. For example, FR-408 is a high-performance FR-4 epoxy resin used for advanced circuitry applications. FR-408 has a low dielectric constant (approximately 3.65) and a low dissipation factor (approximately 0.012) making it an ideal material for circuit designs requiring faster signal speeds or improved signal integrity. Another variety of FR-4 is Polyclad 370HR. Polyclad 370HR has a low dielectric constant (approximately 4.04), similar to FR-408's dielectric constant; however, Polyclad 370 HR has a dissipation factor (approximately 0.021) which is higher than FR-408's dissipation factor. Thus, Polyclad 370HR is inferior to FR-408 for circuit designs requiring fast signal speeds. However, Polyclad 370HR is significantly less expensive than FR-408 and is a satisfactory material for fabricating insulating layer 220 for circuit designs containing power planes or designs requiring slower signals. It will be understood by those skilled in the art that other FR-4 materials may be used to make up insulating layer 220 as well, such as Polyclad 250HR, Polyclad 254, FR-402, FR-406, IS 400 and others.

Figure 3:
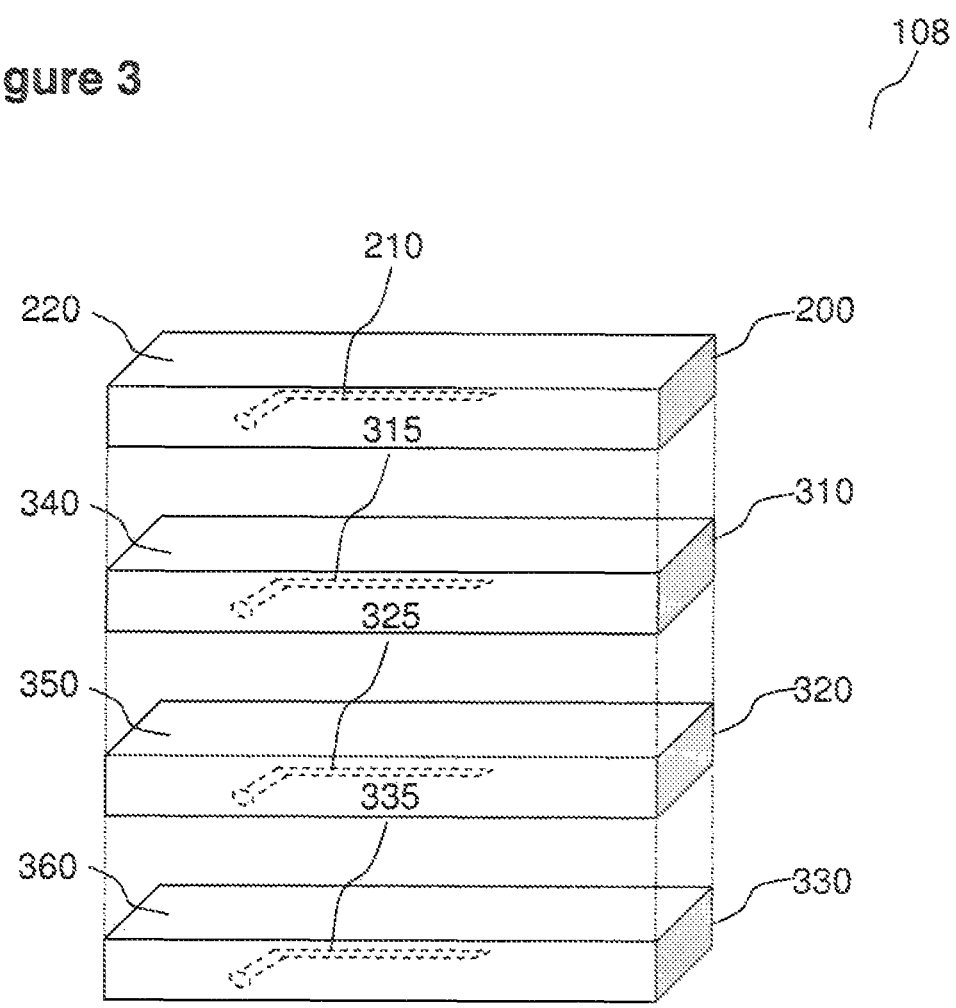
FIG. 3 illustrates an exploded view of an exemplary printed circuit board in accordance with embodiments of the invention.

FIG. 3 illustrates an exploded view of exemplary PCB 108 in accordance with embodiments of the invention. PCB 108 comprises PCB subcomponents 200, 310, 320, and 330 bonded together. Although four PCB subcomponents are shown in FIG. 3, PCB 108 may contain more or less PCB subcomponents. As explained above, PCB subcomponent 200 contains an insulating layer 220 and conductive layer 210 used to provide power and ground planes for PCB 108, or alternatively, conductive layer 210 is patterned to form conductive paths which enable signals to flow from one point of PCB 108 to another. Conductive layer 210 is surrounded by insulating material on all sides, including above and below. PCB subcomponents 310, 320, and 330 also contain insulating layers 340, 350, and 360 and conductive layers 315, 325, and 335 in a similar manner as PCB subcomponent 200. PCB subcomponents 310, 320, and 330 have conductive layers 315, 325, and 335 capable of being used to provide power and ground planes for PCB 108, or alternatively, patterned to form conductive paths which enable signals to flow from one point of PCB 108 to another.

In some embodiments, two different materials comprise the insulating layers (e.g., insulating layer 220 from FIG. 2 and insulating layers 340, 350, and 360 from FIG. 3) of PCB 108. However, each insulating layer 220, 340, 350, and 360 of each PCB subcomponent 200, 310, 320, and 330 may comprise only one material. For example, insulating layer 220 of PCB subcomponent 200 may comprise FR-408, while insulating layer 340 of PCB subcomponent 310 may comprise Polyclad 370HR. Thus, PCB 108 is a hybrid PCB (comprised of more than one material).

As stated above, it is preferable that a material with a low dielectric constant and a low dissipation factor, such as FR-408, comprise the insulating layer (e.g., insulating layer 220 from FIG. 2 and insulating layers 340, 350, and 360 from FIG. 3) of any PCB subcomponent 220, 310, 320, or 330 which is designed to require fast signal speeds or improved signal integrity. Other insulating layers 220, 340, 350, or 360 of PCB 108 may be comprised of a lower cost material, such as Polyclad 370HR, so long as the lower cost material has a dielectric constant similar to the higher cost, low dielectric constant, low dissipation factor material. If the two materials have a significantly different dielectric constant, the embodiment and electrical advantages remain the same; however, more care is needed to tune the vertical connectivity because of the changes in electrical impedance due to the change in materials. These practices are well known to those skilled in the art, or could be extrapolated from current techniques. Thus, PCB 108 is less expensive to produce than a PCB manufactured entirely of a low dielectric constant, low dissipation factor material, such as FR-408. Thus, made from a combination of FR-408 and Polyclad 370HR, PCB 108 provides increased performance, especially for the critical high-speed signal layers, than if manufactured entirely out of a lower cost, low dielectric, high dissipation factor material, such as Polyclad 370HR.

Figure 4:
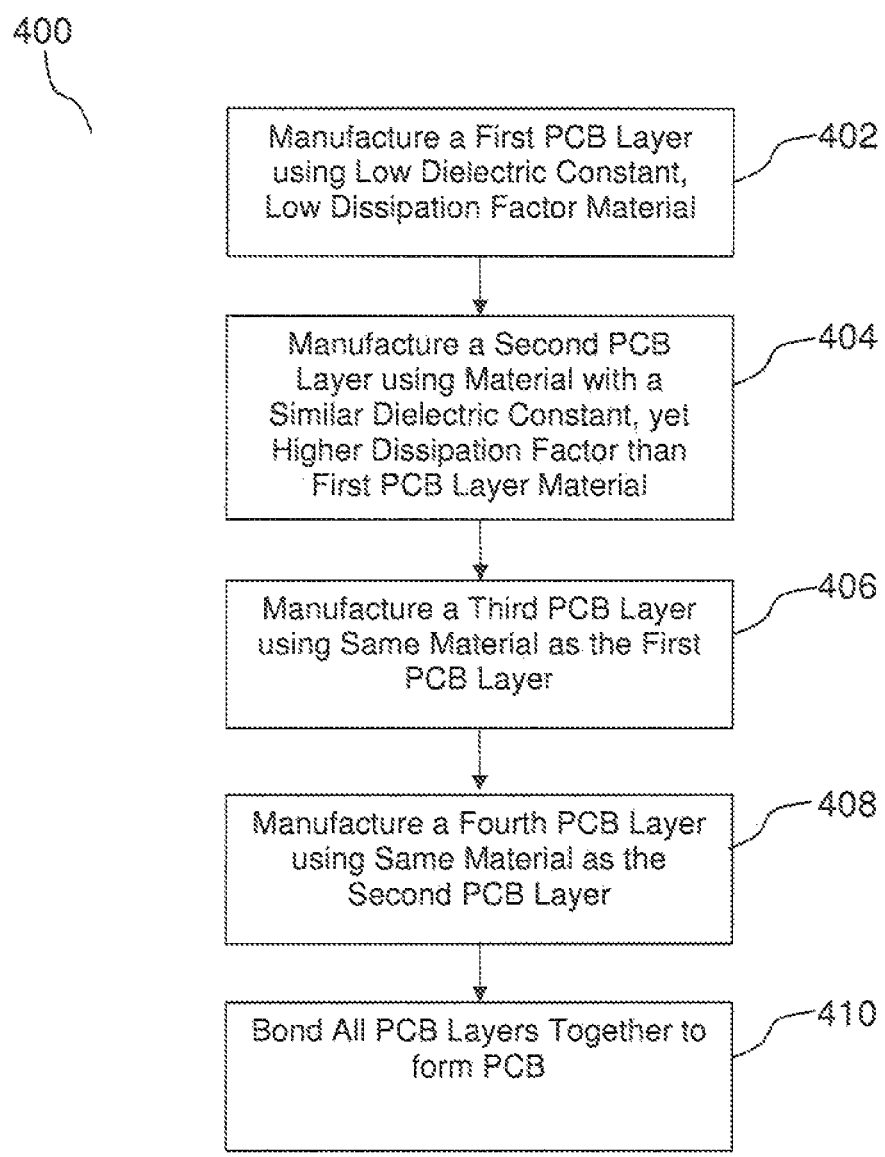
FIG. 4 illustrates a method in accordance with embodiments of the invention.

FIG. 4 illustrates an exemplary flow diagram of a method 400 implemented in accordance with embodiments of the invention. The method begins in block 402 with the manufacture of a first PCB subcomponent (e.g., PCB subcomponent 200 from FIG. 2) with ah insulating layer 220 composed of a material with a low dielectric constant and a low dissipation factor, such as FR-408. In block 404, a second PCB subcomponent (e.g., PCB subcomponent 310 from FIG. 3) is manufactured with an insulating layer 340 composed of a material with a similar dielectric constant as that of the first insulating layer 220's material, yet a higher dissipation factor than the first insulating layer 220's material, such as Polyclad 370HR. In block 406, a third PCB subcomponent (e.g., PCB subcomponent 320 from FIG. 3) is manufactured using the same material as insulating layer 220 (e.g., FR-408) for insulating layer 350. The method continues with the manufacture of a fourth PCB subcomponent (e.g., PCB subcomponent 330 from FIG. 3) using the same material for insulating layer 360 as used in the manufacture of insulating layer 340 (e.g., Polyclad 370HR).

As stated above, the PCB subcomponents 200 and 320 comprising insulating layers 220 and 350 made from the low dielectric constant, low dissipation factor material (e.g., FR-408) are designed for high speed signals. However, the PCB subcomponents 310 and 330 comprising insulating layers 340 and 360 made from the low dielectric constant, high dissipation factor material (e.g., Polyclad 370HR) are designed for power and ground planes as well as for slow speed signals. In block 406, the PCB subcomponents manufactured in blocks 402, 404, 406, and 408 are bonded together to make PCB 108.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus, comprising:
   a printed circuit board ("PCB") comprising a first insulating layer and a second insulating layer,
      wherein the first insulating layer is made of a first material and the second insulating layer is made of a second material;
      wherein the first material has a lower dissipation factor than the second material; and
      wherein the first material and second material have substantially similar dielectric constants.

2. The apparatus of claim 1, wherein the first material is FR-408.

3. The apparatus of claim 1, wherein the second material is Polyclad 370HR.

4. The apparatus of claim 1, wherein the PCB further comprises a third insulating layer,
   wherein the third insulating layer is made of the first material.

5. The apparatus of claim 4, wherein the PCB further comprises a fourth insulating layer,
   wherein the fourth insulating layer is made of the second material.

6. The apparatus of claim 1, wherein the first insulating layer contains a conductive layer that carries high speed signals.

7. The apparatus of claim 1, wherein the second insulating layer comprises one or more power or ground planes.

8. The apparatus of claim 1, wherein the second insulating layer contains a conductive layer that carries low speed signals.

9. The apparatus of claim 1, further comprising:
   a processor mounted to the PCB.

10. A system comprising:
    a first printed circuit board ("PCB") subcomponent comprising a first insulating layer and a first conducting layer; and
    a second PCB subcomponent comprising a second insulating layer and a second conducting layer;
       wherein the first insulating layer is made from a first material and the second insulating layer is made from a second material;
       wherein the first material has a lower dissipation factor than the second material; and
       wherein the first material and second material have substantially similar dielectric constants.

11. The system of claim 10, wherein the first material is FR-408.

12. The system of claim 10, wherein the second material is Polyclad 370HR.

13. The system of claim 10, further comprising a third PCB subcomponent comprising a third insulating layer and a third conducting layer,
    wherein the third insulating layer is made of the first material.

14. The system of claim 13, further comprising a fourth PCB subcomponent comprising a fourth insulating layer and a fourth conducting layer,
    wherein the fourth insulating layer is made of the second material.

15. The system of claim 10, wherein the first conducting layer carries high speed signals.

16. The system of claim 10, wherein the second conducting layer comprises one or more power or ground planes.

17. The system of claim 10, wherein the second conducting layer carries low speed signals.

* * * * *